US008521037B2

(12) United States Patent
Delfyett et al.

(10) Patent No.: US 8,521,037 B2
(45) Date of Patent: Aug. 27, 2013

(54) OPTOELECTRONIC LOGIC GATE (75) Inventors: Peter J. Delfyett, Orlando, FL (US);
Franklyn John Quinlan, Longmont, CO (US); Ibrahim Tuna Ozdur, Orlando, FL (US); Sarper Ozharar, Istanbul (TR)

(73) Assignee: University of Central Florida Research Foundation, Inc., Orlando, FL (US)

( * ) Notice: Subject to any disclaimer, the term of this patent is extended or adjusted under 35 U.S.C. 154(b) by 508 days.

(21) Appl. No.: 12/791,708

(22) Filed: Jun. 1, 2010

(65) Prior Publication Data
US 2010/0303467 A1   Dec. 2, 2010

Related U.S. Application Data (60) Provisional application No. 61/182,588, filed on May 29, 2009.

(51) Int. Cl.
*H04B 10/04* (2006.01)
(52) U.S. Cl.
USPC .......................................... 398/189; 398/183
(58) Field of Classification Search
USPC ................ 359/108; 398/115, 183, 189, 190, 398/191; 341/13, 14; 326/54
See application file for complete search history.

(56) References Cited

U.S. PATENT DOCUMENTS

| | | | | |
|---|---|---|---|---|
| 5,917,638 A * | 6/1999 | Franck et al. | ................. | 398/201 |
| 6,774,986 B2 * | 8/2004 | Laskowski | ...................... | 356/71 |
| 6,865,348 B2 * | 3/2005 | Miyamoto et al. | ............ | 398/183 |
| 7,130,539 B2 * | 10/2006 | Shahar et al. | .................... | 398/46 |
| 2005/0041981 A1 * | 2/2005 | Gill et al. | ....................... | 398/183 |

OTHER PUBLICATIONS

Roy et al. "Integrated all-optical logic and arithmetic operations with the hlep of a TOAD-based interferometer device-alternative approach." Jul. 12, 2007. Applied Optics. Colume 46 pp. 5304-5310.*
Ozharar, Sarper. Stable optical frequency comb generation and appliucations in arbitrary waveform generation, signal processing, and optical data mining. Nov. 12, 2008. University of Central Florida.*

* cited by examiner

*Primary Examiner* — Thomas K Pham
*Assistant Examiner* — William M Johnson
(74) *Attorney, Agent, or Firm* — Thomas | Horstemeyer, LLP (57) ABSTRACT

Systems and methods for implementing and using optoelectronic gates are disclosed. One such method includes superimposing an electrical data bit onto a first optical input to produce a pair of first-stage optical outputs. The first one of the pair of first-stage optical outputs carries the electrical data bit and the second carries the complement of the electrical data bit. The method further includes comparing an electrical target bit with the electrical data bit conveyed by the first first-stage optical outputs and with the complement of the electrical data bit conveyed by the second first-stage optical outputs, to determine whether the electrical target bit and the electrical data bit are same or different.

9 Claims, 8 Drawing Sheets

| $(x, y)$ | A<br>$x \cdot y + \bar{x} \cdot \bar{y}$ | B<br>$x \cdot \bar{y} + \bar{x} \cdot y$ |
|---|---|---|
| (1,1) | 1 | 0 |
| (0,0) | 1 | 0 |
| (1,0) | 0 | 1 |
| (0,1) | 0 | 1 |
|  | (XNOR Gate) | (XOR Gate) |

FIG. 8

OPTOELECTRONIC LOGIC GATE

CROSS REFERENCE TO RELATED APPLICATIONS

This application claims the benefit of U.S. provisional application 61/182,588, filed May 29, 2009, the entirety of which is incorporated herein.

FIELD OF THE DISCLOSURE

The present disclosure relates to optical processing and communication.

BACKGROUND

Boolean exclusive OR (XOR) and exclusive NOR (XNOR) logic gates are useful in applications such as label switching, parity checking, and pattern recognition. Existing implementations of all-optical logic gates are wavelength dependent and cannot process multiple signals at different wavelengths at the same time.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

DETAILED DESCRIPTION

Disclosed herein is an optoelectronic logic gate that is wavelength independent. As a result, the techniques and systems disclosed herein can act on many input signals simultaneously, making use of the large bandwidth that the optical domain offers. Also disclosed herein are applications for target bit pattern extraction and data mining with prerecorded or real time streaming input data. The techniques disclosed herein allow target bit pattern extraction and data mining without prior knowledge about the data bit stream other the data rate. The systems disclosed herein can be scaled, for example, by incorporating multiple interferometric switches and supplying multiple optical frequencies from a modelocked laser. In this manner, longer target patterns can be detected in streaming data, and faster data rates can be supported.

An example method disclosed herein includes superimposing an electrical data bit onto a first optical input to produce a pair of first-stage optical outputs. The first of the pair of first-stage optical inputs carries the electrical data bit and the second carries the complement of the electrical data bit. The method also includes comparing an electrical target bit with the electrical data bit conveyed by the first first-stage optical outputs and with the complement of the electrical data bit conveyed by the second first-stage optical outputs, to determine whether the electrical target bit and the electrical data bit are same or different.

An example apparatus disclosed herein includes a first stage interferometric switch and a second stage comprising a pair of interferometric switches. The first stage interferometric switch is configured to: receive an electrical data bit and a first optical input; and output a pair of first-stage optical outputs. The first one of the pair of first-stage optical inputs carries the electrical data bit and the second one carries the complement of the electrical data bit. Each of the pair of interferometric switches in the second stage receives one of the first-stage optical outputs. The pair of interferometric switches in the second stage is configured to produce another optical output indicating whether the electrical target bit and the electrical data bit are same or different.

Another example apparatus disclosed herein includes a first stage interferometric switch and a second stage comprising a pair of optical modulators. The first stage interferometric switch is configured to: receive an electrical data bit and a first optical input; and output a pair of first-stage optical outputs. The first one of the pair of first-stage optical inputs carries the electrical data bit and the second one carries the complement of the electrical data bit. Each of the pair of optical modulators in the second stage receives one of the first-stage optical outputs. The pair of optical modulators is configured to produce another optical output indicating whether the electrical target bit and the electrical data bit are same or different.

Yet another example apparatus disclosed herein includes a first stage interferometric switch and a means for comparing. The first stage interferometric switch is configured to receive an electrical data bit and a first optical input; and output a pair of first-stage optical outputs. The first one of the pair of first-stage optical inputs carries the electrical data bit and the second one carries the complement of the electrical data bit. The means for comparing compares an electrical target bit with the electrical data bit conveyed by the first first-stage optical outputs and with the complement of the electrical data bit conveyed by the second first-stage optical outputs, to determine whether the electrical target and the electrical data are same or different.

Another method is disclosed herein for detecting a target pattern in a data stream. The method includes receiving an electrical target bitstream having N bits; receiving an electrical data bitstream; and generating N delayed electrical data bitstreams from the received electrical data bitstream. Each of the N delayed electrical data bitstreams is delayed by an additional bit time as compared to the previous one of the N delayed electrical data bitstreams. The method also includes superimposing the data bits from one of the N delayed electrical data bitstreams onto a first optical input bitstream to produce a pair of first-stage optical output bitstreams. The first one of the pair of first-stage optical output bitstreams carries the data bits from the one of the N delayed electrical data bitstreams and the second one carries complement of the data bits from the one of the N delayed electrical data bitstreams. The method also includes comparing the target bits from the electrical target bitstream with the data bits conveyed by the first one of the first-stage optical output bitstreams and with the complement of the electrical data bit conveyed by the second one of the first-stage optical output bitstreams to determine whether each of the target bits is same as each of the respective data bits. The method also includes repeating the superimposing and the comparing with successive ones of the N delayed electrical bitstreams; and indicating a match when N of the target bits are determined to be same.

An example apparatus is disclosed for detecting a target pattern in a data stream. The apparatus includes an electrical domain delay generator; a first stage interferometric switch; a second stage; and a match stage. The electrical domain delay generator is configured to: receive an electrical data bitstream; and generate N delayed electrical data bitstreams from the received electrical data bitstream. Each of the N delayed electrical data bitstreams is delayed by an additional bit time as compared to the previous one of the N delayed electrical data bitstreams. The electrical domain delay generator is also configured to receive an electrical target bitstream having N bits. The first stage interferometric switch is configured to: receive the data bits from one of the N delayed electrical data bitstreams; receive a first optical input bitstream; and output a pair of first-stage optical output bitstreams. The first one of the pair of first-stage optical output bitstreams carries the data bits from the one of the N delayed electrical data bitstreams and the second one carries the complement of the data bits from the one of the N delayed electrical data bitstreams. The second stage includes a pair of optical amplitude modulators. The first optical amplitude modulator receives one of the first-stage optical output bitstreams and the electrical target bit stream. The second optical amplitude modulator receives the other the first-stage optical output bitstreams and the complement of the electrical target bit stream. The pair is configured to produce another optical output bitstream indicating whether the target bits and the data bits are same. The match stage is configured to: monitor the another optical output bitstream for an indication that one of the target bits and a respective one the data bits is same; and indicate a match when N of the target bits are determined to be same.

Another example apparatus is disclosed for detecting a target pattern in a data stream. The apparatus includes: an electrical domain delay generator; an array of interferometric switches; a pair of optical wavelength combiners; a second stage including a pair of optical amplitude modulators; an optical wavelength splitter; and a match stage. The electrical domain delay generator is configured to: receive an electrical data bitstream; and generate N delayed electrical data bitstreams from the received electrical data bitstream. Each of the N delayed electrical data bitstreams is delayed by an additional bit time as compared to the previous one of the N delayed electrical data bitstreams. In the array of interferometric switches, each switch is configured to: receive a respective one of the N delayed electrical data bitstreams; receive a first optical input timing bitstream at one of a plurality of different wavelengths; and output a pair of first-stage optical output bitstreams at a respective one the different wavelengths. The first one of the pair of first-stage optical output bitstreams carries the data bits from the one of the N delayed electrical data bitstreams and the second one carries the complement of the data bits from the one of the N delayed electrical data bitstreams. The pair of optical wavelength combiners is configured to: receive one of first-stage optical output bitstreams from each of the interferometric switches; combine the received first-stage optical output bitstreams to produce a combined first-stage optical output bitstream. The first optical wavelength combiner carries the data bits from the one of the N delayed electrical data bitstreams. The second optical wavelength combiner carries the complement of the data bits from the one of the N delayed electrical data bitstreams. The first optical amplitude modulator in the second stage receives one of the first-stage optical output bitstreams and the electrical target bit stream, the second optical amplitude modulator in the second stage receives the other the first-stage optical output bitstreams and the complement of the electrical target bit stream. The pair of optical amplitude modulators in the second stage is configured to produce another optical output bitstream indicating whether the target bits and the data bits are same. The optical wavelength splitter is configured to produce a plurality of optical output bitstreams together indicating whether the target bits and the data bits are same. The match stage is configured to: monitor the plurality of optical output bitstreams for an indication that one of the target bits and a respective one the data bits is same; and indicate a match when N of the target bits are determined to be same.

Figure 1:
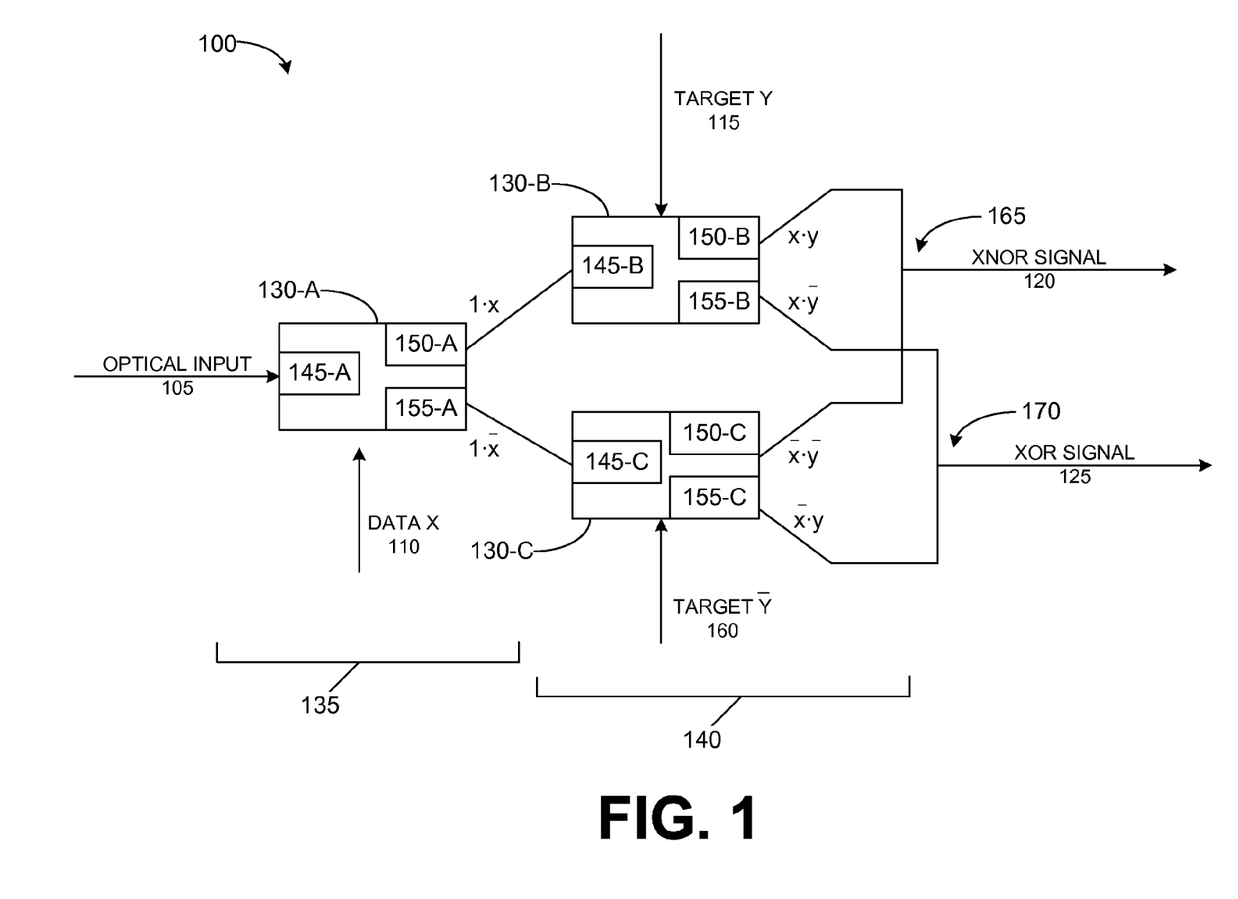
FIG. 1 is a block diagram of one embodiment of an optoelectronic logic gate as disclosed herein.

FIG. 1 is a block diagram of one embodiment of an optoelectronic logic gate as disclosed herein. Logic gate 100 receives an input optical signal 105. Logic gate 100 also receives as input an electrical data signal x 110, and an electrical target signal y 115, both of which are treated as binary or bit values. Logic gate 100 performs a Boolean logic XNOR and XOR function on the two binary values (data signal x 110 and target signal y 115), to produce as output an optical XNOR signal 120 and an optical XOR signal 125. Logic gate 100 is thus an optoelectronic gate, since an optical input is transformed into an optical output, based on two control signals in the electrical domain.

Logic gate 100 utilizes three 1×2 (one input, two output) interferometric switches (IS) 130-A, 130-B, 130-C. Logic gate 100 includes two parts or stages. A first stage 135 comprises the single interferometric switch 130-A for single bit operation. The first stage 135 is also referred to herein as the "data imprint stage", since data signal x 110 is imprinted, or superimposed, onto input optical signal 105. A second stage 140 comprises the two interferometric switches 130-B, 130-C, configured in parallel. The second stage 140 is also referred to herein as the "comparator stage", since in this stage the input data superimposed on the optical signal is compared with target signal y 115. This comparison is performed in the electrical domain. Interferometric switches 130-A, 130-B, 130-C work as follows. When a control voltage $V_\pi$ is applied, the entire input optical signal is directed to one of the output ports; similarly, when the applied control voltage is $V_{2\pi}$, then the entire input optical signal is directed to the other output port. Thus, in FIG. 1, when $V_\pi$ is applied to interferometric switch 130-A, the entire input optical signal 105 received at input port 145-A is directed to a first output port 150-A; when $V_{2\pi}$, is applied to interferometric switch 130-A then all of input optical signal 105 is directed to a second output port 155-A. Similarly, interferometric switch 130-B includes an input port 145-B and two output ports 150-B, 155-B, and interferometric switch 130-C includes an input port 145-C and two output ports 150-C, 155-C.

Because a voltage of $V_{2\pi}$ results in an optical 0 bit (i.e., minimum optical power) being produced at the first output port, voltage $V_{2\pi}$ represents an electrical 0 bit (i.e., logic FALSE) Similarly, $V_\pi$ represents an electrical 1 bit (i.e., logic TRUE), since it results in an optical 1 bit (i.e., maximum optical power) being produced at the first output port. When a non-zero optical input is presented to an interferometric switch 130-A, 130-B, 130-C, then the outputs at the two ports of that interferometric switch 130-A, 130-B, 130-C are complementary to each other, and are independent of the applied electrical bit.

In this manner, the first stage interferometric switch 130-A is configured to receive an electrical data bit and a first optical input, and outputs a pair of first-stage optical outputs. The first one of the pair of first-stage optical inputs carries the electrical data bit and the second one carries the complement of the electrical data bit. Each of the pair of interferometric switches in the second stage is configured to receive one of the first-stage optical outputs. The pair of interferometric switches in the second stage produces another optical output indicating whether the electrical target bit and the electrical data bit are same or different. The pair of interferometric switches in the second stage is thus a means for comparing an electrical target bit with the electrical data bit conveyed by the first first-stage optical outputs and with the complement of the electrical data bit conveyed by the second first-stage optical outputs, to determine whether the electrical target and the electrical data are same or different.

Having discussed the structure of logic gate 100, the resulting operation of logic gate 100 will now be discussed with continued reference to FIG. 1. When electrical data bit x 110 is applied to the interferometric switch 130-A of the first stage 140 and input optical signal 105 is an optical 1, the output at the port 150-A of interferometric switch 130-A is 1·x and the output at port 155-A of interferometric switch 130-A is 1·$\bar{x}$. In this manner, an electrical data bit x 110 is superimposed onto an optical input 105 to produce a pair of first-stage optical outputs 150-A, 150-B, where first of the pair 150-A carries the electrical data bit and the second of the pair 150-B carries the complement of the electrical data bit.

In the second stage 140, the optical output at port 150-A of interferometric switch 130-A is supplied to the optical input of interferometric switch 130-B. Target signal y 115 is applied as the electrical input of interferometric switch 130-B. Similarly, the optical output at port 155-A of interferometric switch 130-A is supplied to the optical input of interferometric switch 130-C and the interferometric switch 130-C is driven electrically by a signal 160 that is the negation of target signal y 115 (i.e., $\bar{y}$). Though FIG. 1 shows separate target bit inputs to interferometric switches 130-B, 130-C, in other embodiments these target bit inputs are both driven by the same electrical waveform but biased at different DC levels, resulting in inverse modulations.

Combiner 165 combines output port 150-B of interferometric switch 130-B with output port 150-C of interferometric switch 130-C, producing a result which output from logic gate 100 as optical XNOR signal 120. Correspondingly, combiner 170 combines output port 155-B of interferometric switch 130-B with output port 155-C of interferometric switch 130-C, producing a result which is output from logic gate 100 as optical XOR signal 125. Thus, when the input data bit is x and the target bit is y, then optical XNOR signal 120 is x·y+$\bar{x}$·$\bar{y}$, and at the same time optical XOR signal 125 is x·$\bar{y}$+$\bar{x}$·y. In this manner, the electrical target bit y 115 is compared with the electrical data bit x 110 (conveyed by the first output 150-B of the first-stage optical outputs), and the electrical target bit x 110 is also compared with the complement of the electrical data bit (conveyed by the second output 150-C of the first-stage optical outputs), to determine whether the electrical target bit y 115 and the electrical data bit x 110 are same or different.

Figure 2:
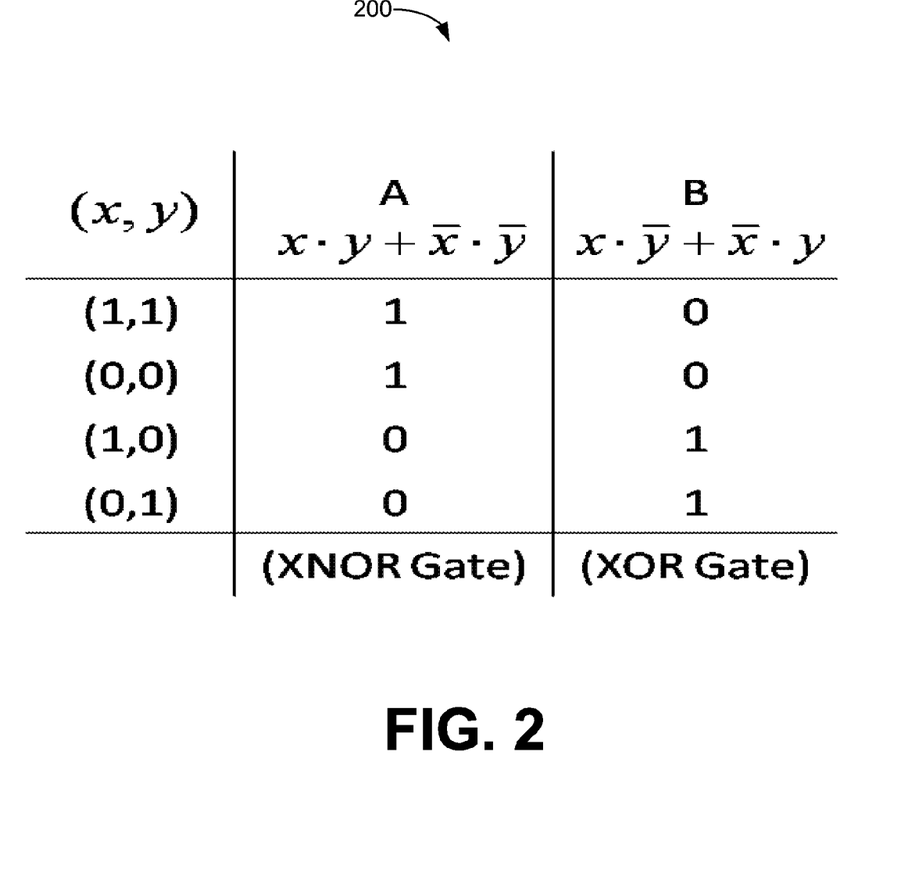
FIG. 2 illustrates a truth table showing outputs of the logic gate of FIG. 1, according to some embodiments disclosed herein.

FIG. 2 illustrates a truth table showing outputs of logic gate 100. As can be seen in truth table 200, if x=y, then the value of binary signal 120 is 1, but if x≠y, then the value is 0, which is identical to an XNOR gate. Correspondingly, if x≠y, then the value of binary signal 125 is 1, but if x=y, then the value is 0, which is identical to an XOR gate.

Figure 3:
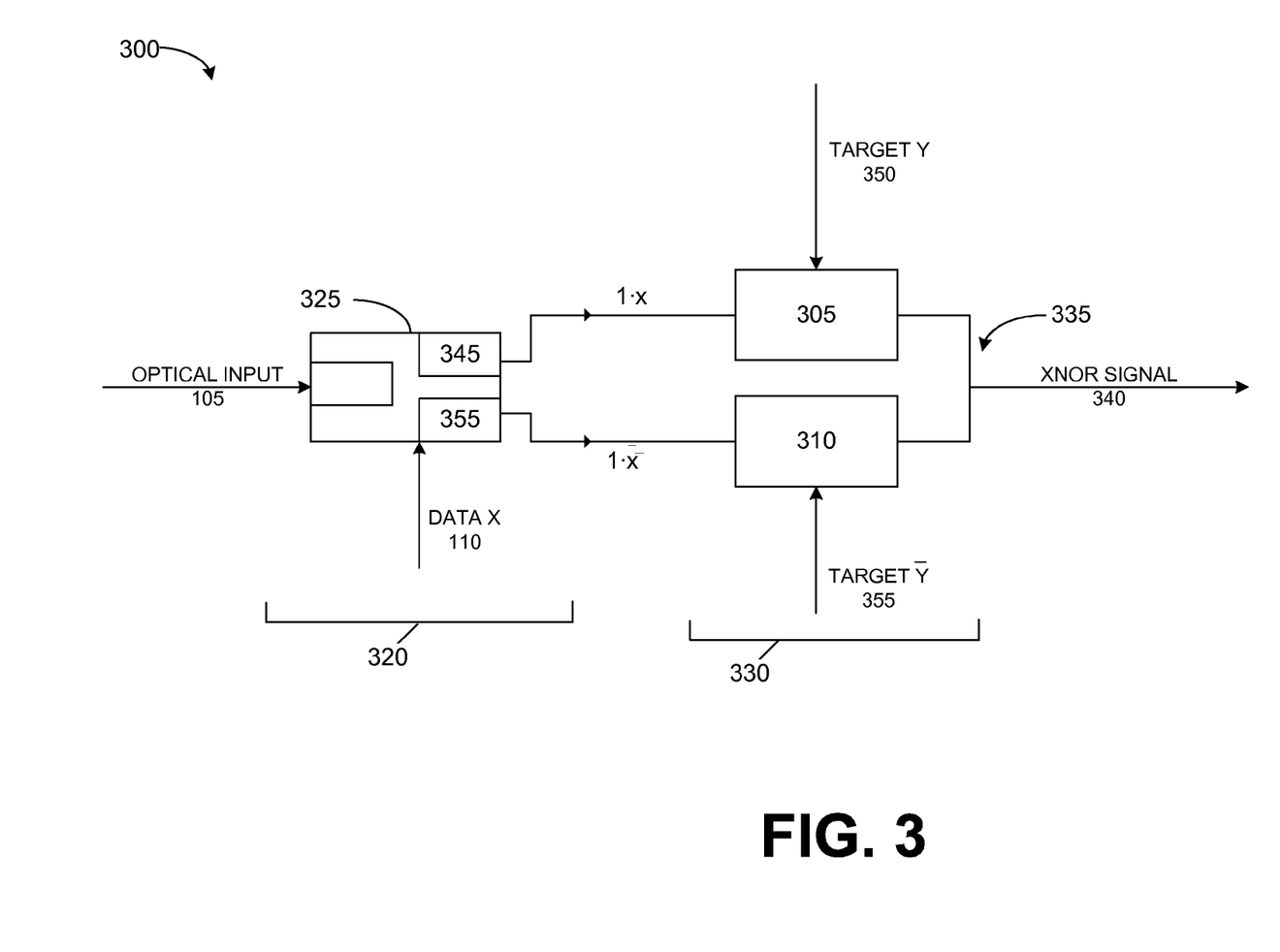
FIG. 3 is a block diagram of another embodiment of an optoelectronic logic gate as disclosed herein.

As described above, logic gate 100 produces two outputs, optical XOR signal 125 and optical XNOR signal 120. FIG. 3 is a block diagram of another embodiment of an optoelectronic logic gate disclosed herein which produces a single XNOR output. Logic gate 300 is similar to that of FIG. 1 but amplitude modulators 305, 310 are used in place of interferometric switches 130-B and 130-C. In other words, a first stage 320 includes an interferometric switch 325 and a second stage 330 includes amplitude modulators 305, 310. No loss of generality is caused by use of amplitude modulators, since the output at port 150 of any interferometric switch is identical to the output of an amplitude modulator under the same conditions. A combiner 335 combines outputs from amplitude modulators 305, 310 to produce an optical XNOR signal 340.

The components of logic gate 300 are arranged similarly to logic gate 100. One output 345 of interferometric switch 325 provides optical input to amplitude modulator 305, while target electrical signal y 350 controls amplitude modulator 305. Another output 355 of interferometric switch 325 provides optical input to amplitude modulator 310, while negated target electrical signal $\bar{y}$ 360 controls amplitude modulator 310.

The behavior here is similar to that of the switches described above in connection with FIG. 1: when optical input to interferometric switch 325 is an optical 1 and electrical data bit x is applied to interferometric switch 325, the output at port 345 is 1·x and the output at port 355 is 1·$\bar{x}$. Therefore, the output of amplitude modulator 305 is x·y and the output of amplitude modulator 310 is $\bar{x}$·$\bar{y}$, such that the combined output 340 is x·y+$\bar{x}$·$\bar{y}$. In this manner, the first stage interferometric switch 325 is configured to receive an electrical data bit and a first optical input; and output a pair of first-stage optical outputs. The first one of the pair of first-stage optical inputs carries the electrical data bit and the second one carries the complement of the electrical data bit. Each of the pair of optical modulators 305, 310 in the second stage 330 receives one of the first-stage optical outputs. The pair of optical modulators 305, 310 is configured to produce another optical output indicating whether the electrical target bit and the electrical data bit are same or different. The second stage 330 is thus a means for comparing an electrical target bit with the electrical data bit conveyed by the first of the first-stage optical outputs and with the complement of the electrical data bit conveyed by the second of the first-stage optical outputs, to determine whether the electrical target and the electrical data are same or different. Each of the pair of optical modulators is also configured to produce a pair of second-stage optical outputs. The second stage is configured to produce the another optical output by combining one of the second-stage optical outputs from one of the pair of optical modulators with one of the second-stage optical outputs from the other one of the pair of optical modulators.

Figure 4:
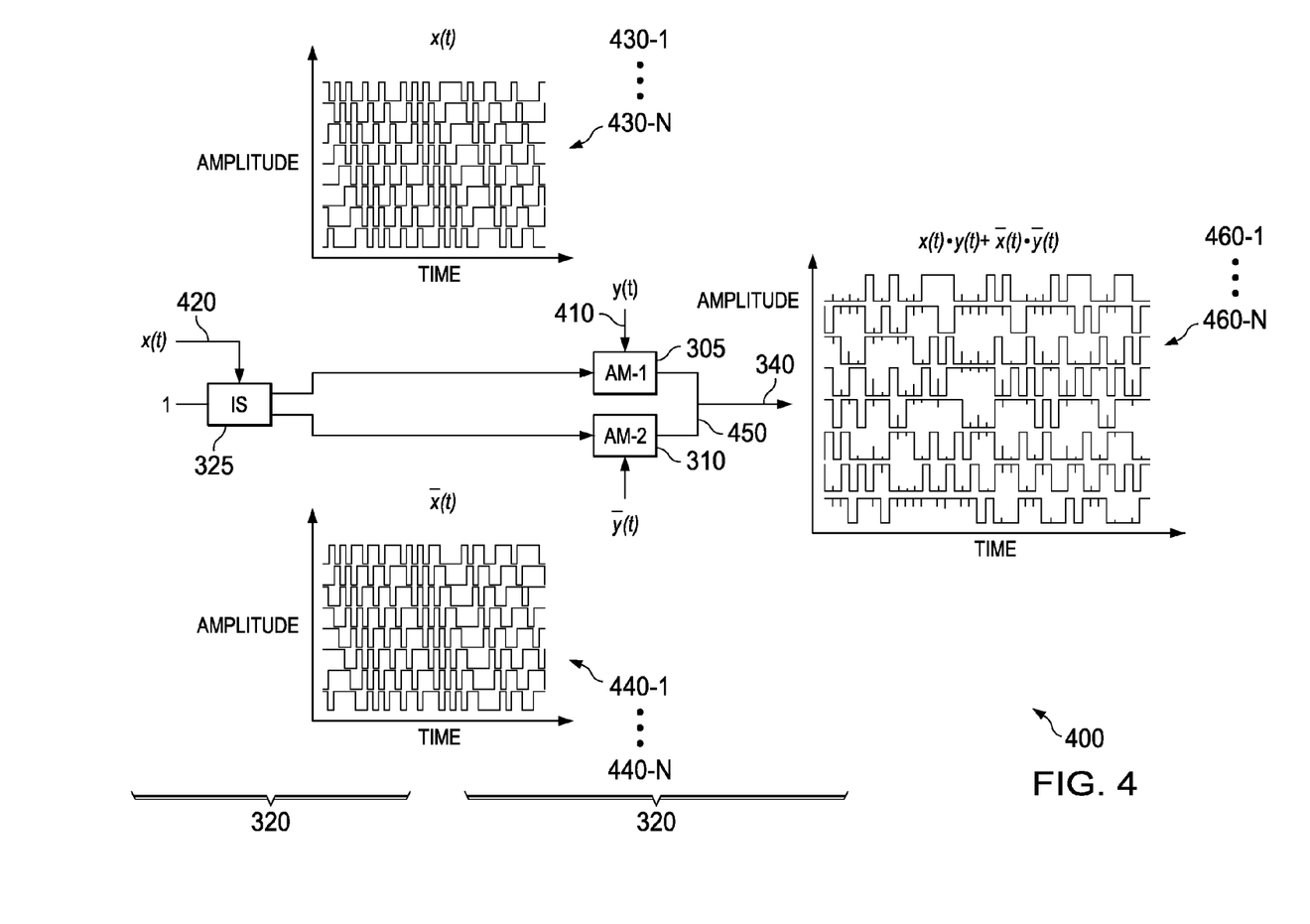
FIG. 4 is a block diagram of a system for bit pattern detection using the logic gate of FIG. 3, according to some embodiments disclosed herein.

FIG. 4 is a block diagram of a system for bit pattern detection which uses a stored data stream and single XNOR logic gate 300. As described herein, a match between target signal bits in the range $y_1 \ldots y_N$ and the input data bits in the range $x_{m+1} \ldots x_{m+n}$ represent a match on an target pattern of length N-bits inside the streaming input data. System 400 detects this match by looking for N consecutive "1" bits that are synchronized with the target signal at output 340 of logic gate 300. Having found these consecutive bits, system 400 counts this electronically (counter not shown), confirming both the existence and the location of the target pattern in the input data stream.

In other words, stage 330 of logic gate 300 (the comparator stage) is driven periodically by the target pattern 410 which includes of bits $y_1 \ldots y_N$, and if the target pattern matches the input data stream then the output of system 400 indicates N consecutive "1" bits were detected. This approach relies on relative timing between the input data signal and the target pattern. That is, the target pattern will not be detected if $y_1$ does not overlap with $x_{m+1}$ in time. For this reason, although target pattern 410 is a single series of bits, system 400 provides input to stage 330 as multiple series of bits, each with a different delay. In this manner, the target pattern includes all possible relative timings.

In FIG. 4, the example input data stream 420 has the value "CRE" and the 8-bit target pattern 410 has the value "R". ("CREOL" is "01000011010100100100101" in binary. "R" is "01010010" in binary). In this example the target pattern 410 is 8 bits long, so comparator stage 330 checks all 8 possible relative timings between the input data and the target pattern consecutively.

System 400 operates on a stored input signal 420. This stored input signal 420 is provided to first stage 320, which produces eight delayed versions 430-1 ... 430-N of the input signal and eight delayed versions 440-1 ... 440-N of the negated input signal. Delayed samples 430-1 ... 430-N are provided, consecutively, to amplitude modulator 305 in stage 330. Delayed samples 440-1 ... 440-N are provided, consecutively, to amplitude modulator 310 in stage 330. The outputs of amplitude modulators 305, 310 are combined by combiner 450. After combination, optical output 340 includes waveforms 460-1 ... 460-N, each one corresponding to a respective delay. As can be seen in FIG. 4, only one of the delayed channels (bottom channel 460-N) results in 8 consecutive "1" bits that synchronized with the target pattern at the output, which confirms the existence and the location of the letter "R" in the input data stream.

Figure 5:
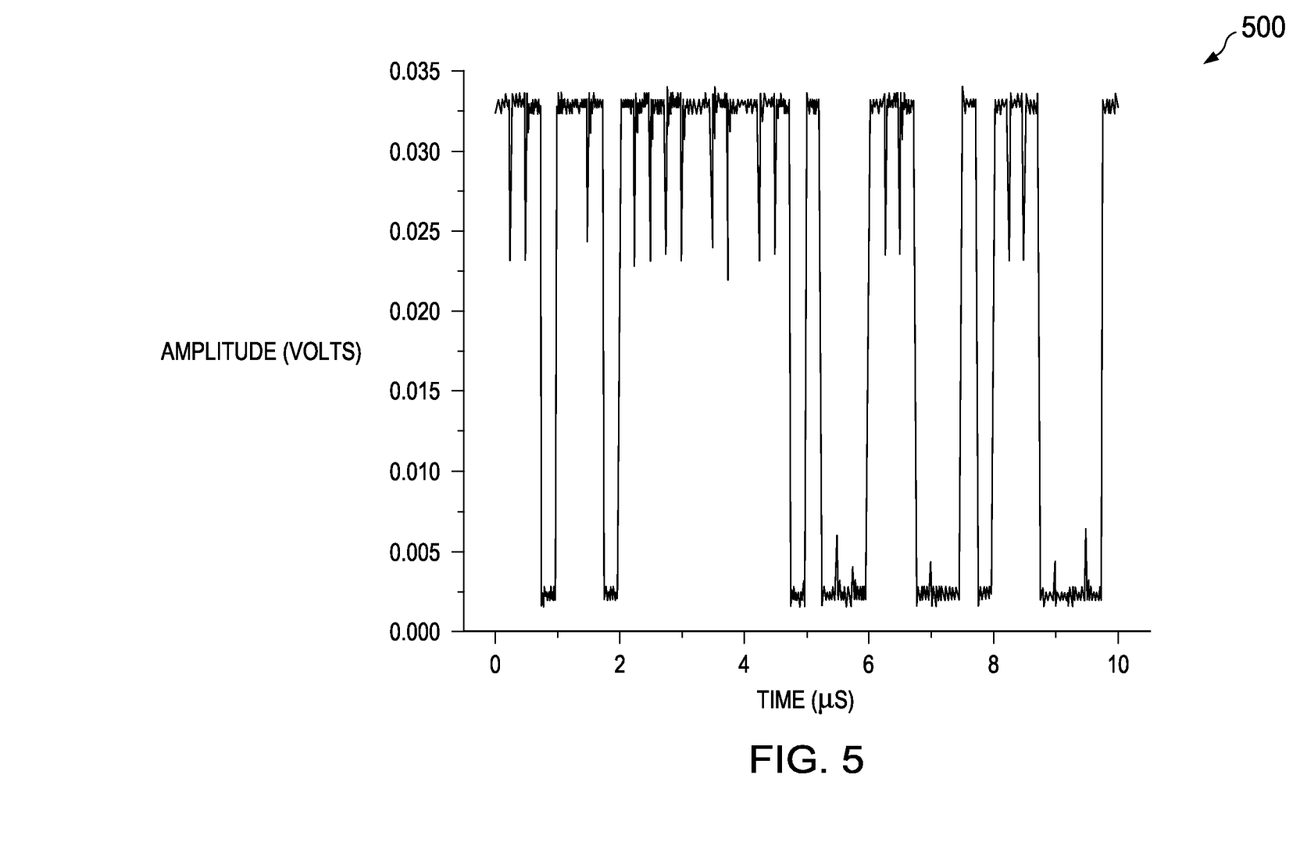
FIG. 5 illustrates an oscilloscope trace of the waveform channel from FIG. 4, according to some embodiments disclosed herein.

FIG. 5 illustrates an oscilloscope trace of waveform channel 460-N. As can be seen in trace 500, all 8 bits of the target pattern match one by one to the corresponding bits in the input data stream. A person of ordinary skill in the art should recognize that an electronic counter can be substituted for the oscilloscope.

While system 400 uses single XNOR logic gate 300, another embodiment of a bit pattern extraction system uses the dual output logic gate 100 but monitors only optical XNOR signal 120. Yet another embodiment of a bit pattern extraction system uses the dual output gate of FIG. 1 but monitors only optical XOR signal 125. Still another embodiment monitors optical XNOR signal 120 and optical XOR signal 125 at substantially the same time, which results in an improved signal-to-noise ratio of the system and reduced probability of false positives.

Unlike conventional electrical or all-optical logic gates, the optoelectronic logic gates disclosed herein are independent of the input wavelength. This independence allows all the relative timing signals to be provided to the comparator stage simultaneously, using a different wavelength for each channel. This speed-up allows N-bit pattern matching for real time streaming data.

Figure 6:
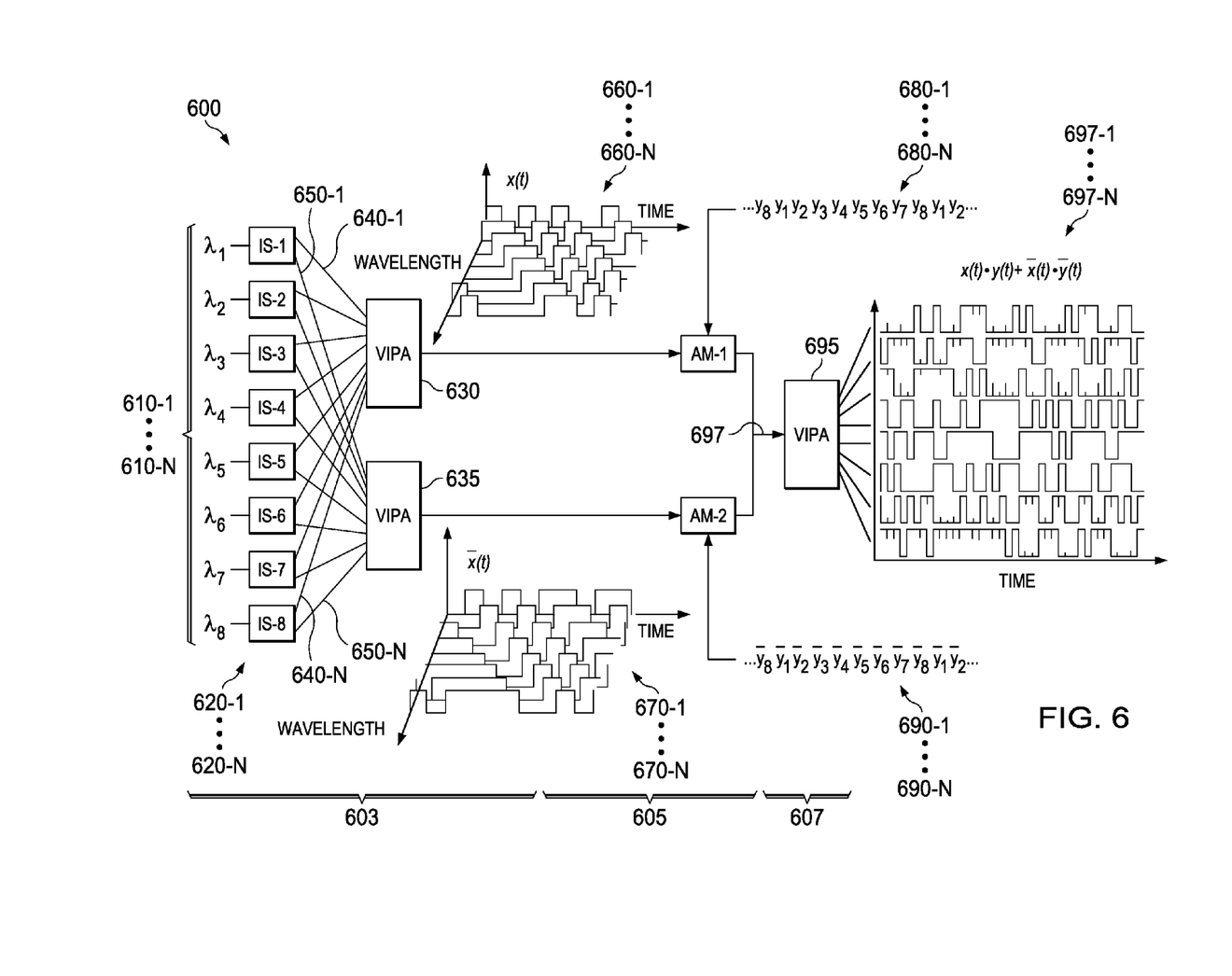
FIG. 6 is a block diagram of yet another embodiment of an optoelectronic logic gate, according to some embodiments disclosed herein.

FIG. 6 is a block diagram of another embodiment of an optoelectronic logic gate which uses N optical data channels to detect an N-bit target pattern. Each data channel is on a different wavelength and is time-delayed by one bit with respect to its neighboring channels. Logic gate 600 is optimized for 8 bit long target pattern extraction, but the principles are applicable to N bits. For example, multiple interferometric switches can be used together with the spectrum of a mode-locked laser with multiple stable comb lines.

Like other embodiments described herein, logic gate 600 includes a first stage 603 which superimposes or imprints an electrical data bit onto an optical signal, and a second stage 605 which compares the input data superimposed on the optical signal with an electrical target data bit. Logic gate 600 also includes a match stage 607 which produces an output indicating whether the target bits and the data bits are the same. In the embodiment of FIG. 6, the first stage 603 is implemented with an array of interferometric switches, the second stage 605 is implemented with optical amplitude modulators, and the match stage 607 is implemented with an optical splitter.

Rather than a single electrical bitstream, the first stage receives as input a set of N delayed electrical data bitstreams 660-1 ... 660-N, each delayed by an additional bit time as compared to the previous one. Each interferometric switch 620-1 ... 620-N in the first stage also receives as input an optical signal 610-1 ... 610-N at a different wavelength. Each interferometric switch 620-1 ... 620-N superimposes a respective delayed version of data bit 660-1 ... 660-N onto the optical signal 610-1 ... 610-N at a respective wavelength, producing as output a pair of first-stage optical output bitstreams 640-1 ... N, 650-1 ... N at a respective one of a plurality of different wavelengths. The first one 640-1 ... N of the pair of optical outputs carries the data bits from the respective delayed electrical data bitstreams. The second one 650-1 ... N of the pair of optical outputs carries the complement of the data bits from the respective one of the N delayed electrical data bitstreams.

The second stage 605 is configured to receive an electrical target bit stream 680-1 ... 680-N, a complement of the electrical target bit stream 690-1 ... 680-N, and the pair of first stage optical output bitstreams 640-1 ... N, 650-1 ... N. The second stage 605 is further configured to produce another optical output bitstream indicating whether the target bits and the data bits are same.

Match stage 607 is configured to monitor the plurality of optical output bitstreams for an indication that one of the target bits and a respective one the data bits is the same. and to produce an output 697 representing whether the target bits and data bits match. In some embodiments, output 697 indicates a match when N of the target bits are determined to be same.

Having discussed the structure of logic gate 600, the resulting operation of logic gate 600 will now be discussed with continued reference to FIG. 6. N optical inputs 610-1 ... 610-N on separate wavelength channels $\lambda_1 \ldots \lambda_N$ are each modulated by a corresponding first-stage interferometric switch 620-1 ... 620-N. The wavelengths are combined by two virtually imaged phased arrays (VIPA) 630, 635. Input to VIPA 630 is provided by one of the optical outputs 640-1 ... N of a corresponding interferometric switch 620-1 ... N. Input to VIPA 635 is provided by the one of the other optical outputs 650-1 ... N of a corresponding interferometric switch 620-1 ... N. Each wavelength carries the same input data, but with an additional 1-bit time delay with respect to its neighboring channels. The example logic gate 600 embodiment shown in FIG. 6 realizes the time delay in the electrical domain by driving the interferometric switches 620-1 ... N with delayed electrical waveforms. Other embodiments realize the time delay between the channels in the optical domain by delaying the modulated optical signals Multiple input data streams, together covering all the possible relative timings with respect to the target waveform, enter stage 330 (comparator stage) of logic gate 600. Specifically, data stream 660-1 ... 660-N, representing x, enters amplitude modulator 305 and data stream 670-1 ... 670-N, representing $\bar{x}$, enters amplitude modulator 310. Amplitude modulator 305 then compares x (660-1 ... 660-N) to the target pattern 680-1...680-N. Amplitude modulator 310 then compares $\bar{x}$ (680-1 ... 680-N) to the negated target pattern 690-1 ... 680-N. In this manner, logic gate 600 simultaneously checks all data streams for the target pattern. Another VIPA 695 at the output of stage 330 separates the channels of combined optical output signal 697 into an output signal 697 which indicates whether the target bits and the data bits are the same. When used in a target detector, the channels may be provided to N corresponding electronic counters, which will check for 8 consecutive "1"s synchronized with the target signal.

Figure 7:
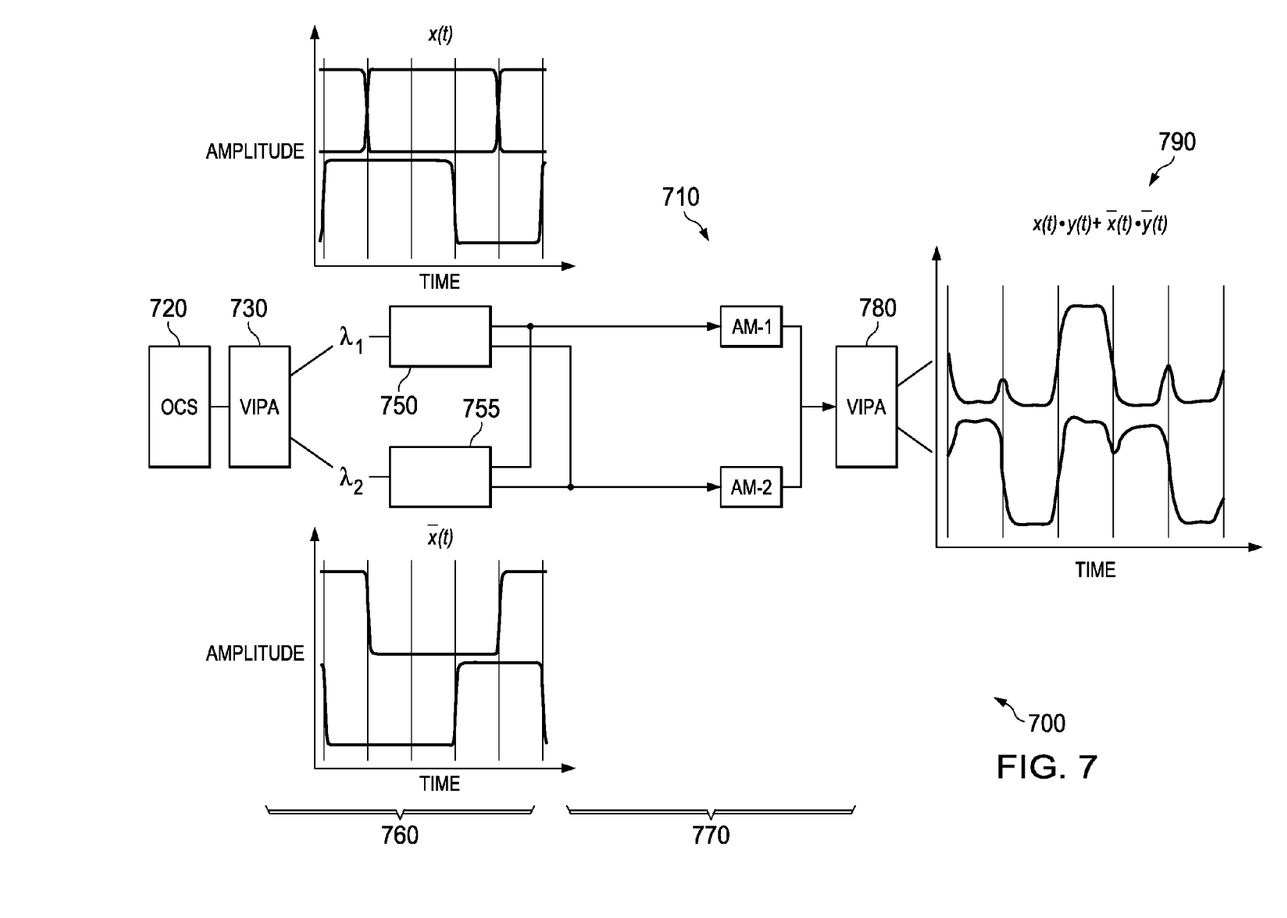
FIG. 7 is a block diagram of another system for bit pattern detection using an optoelectronic logic gate, according to some embodiments disclosed herein.

FIG. 7 is a block diagram of a system for bit pattern detection in streaming data. System 700 uses an optoelectronic gate 710 which is similar to logic gate 600, but fiberized couplers 720 are used to combine the modulated channels instead of virtually imaged phased arrays. Although system 700 uses fiberized components, other embodiments implement the same layout on the chip scale for improved channel number and stability.

A multiple wavelength optical input is provided to virtually imaged phased array 730, which performs spatial separation of the single input into two inputs at two wavelengths, $\lambda_1$ and $\lambda_2$. The separated optical signals are provided to interferometric switches 750, 755, respectively. Interferometric switches 750, 755 form a first stage 760, imprinting input data onto optical signal $\lambda_2$ and its 1-bit delayed version is imprinted onto $\lambda_1$.

After data imprinting by first stage 760, the wavelengths are combined with a fiberized coupler (not shown). The comparator stage 770 then processes both wavelengths (i.e., both input signals) simultaneously. After comparator stage 770, the wavelengths are separated with another VIPA 780. In the example system of FIG. 7, data carried on these wavelengths is depicted as an oscilloscope trace 790. When used in a target detector, the separate wavelengths are provided to N corresponding electronic counters, which will check for N consecutive "1"s synchronized with the target signal.

Figure 8:
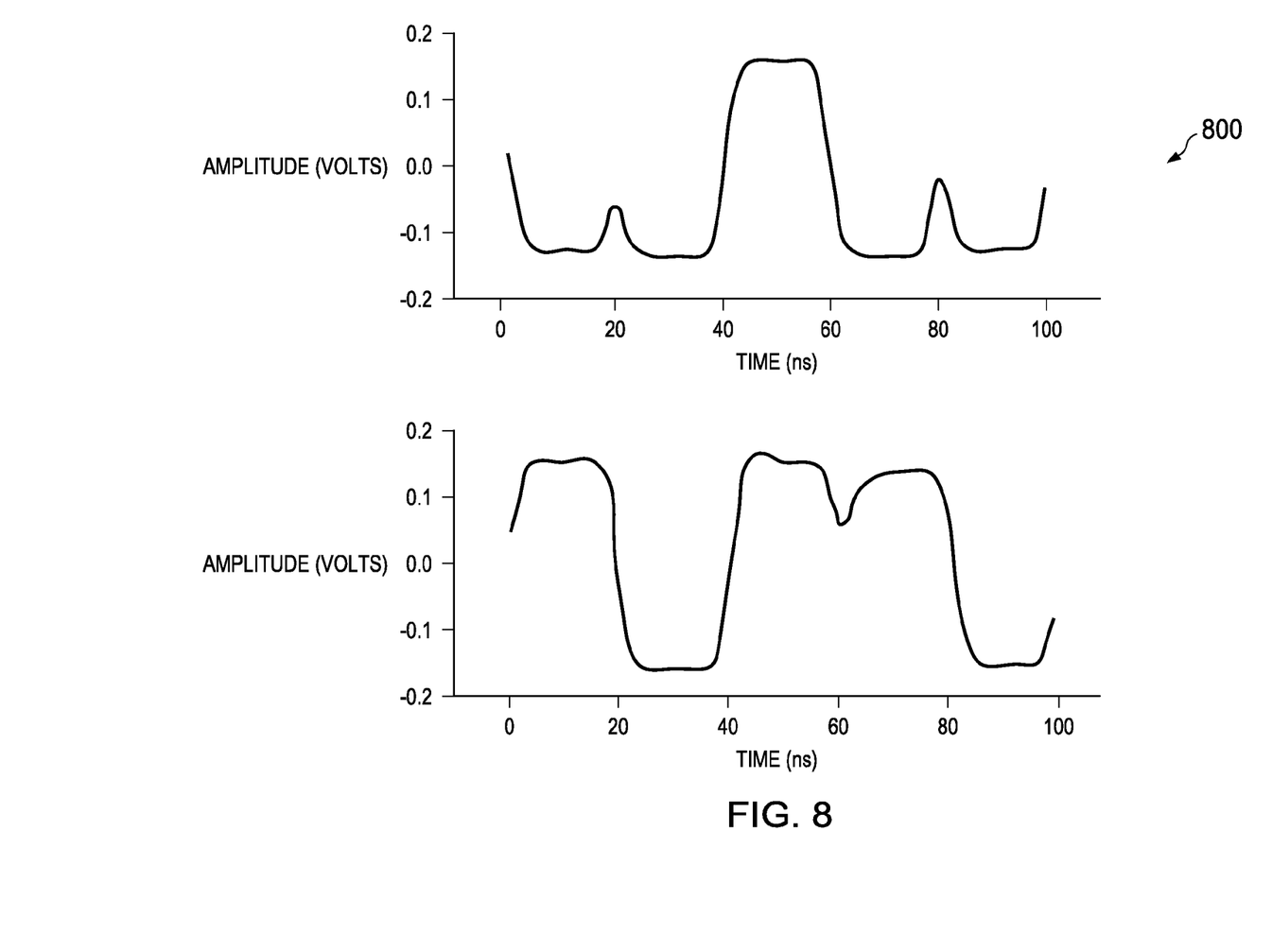
FIG. 8 illustrates an example oscilloscope trace generated by the system of FIG. 7, according to some embodiments disclosed herein.

FIG. 8 illustrates the oscilloscope trace from FIG. 7 in further detail. As can be seen in trace 800, the channel $\lambda_2$ has two consecutive "1" bits, while the other channel does not. Thus, the system has successfully detected and located the 2-bit long target pattern inside the real time streaming input data, in the time slot between 40 ns and 80 ns.

As noted earlier, an electronic counter can be substituted for the oscilloscope. In some embodiments of the streaming data detector, the counter takes into account a periodic target stream, where the presence of N consecutive "1" bits does not necessarily imply the existence of the N-bit long target pattern. Since the target waveform is periodic, an input data stream that includes any cyclic permutation of the target waveform will also result in N consecutive "1" bits in one of the channels. Therefore the necessary and sufficient condition for confirming the existence of the target pattern inside the input data is having N consecutive "1" bits where the first "1" bit overlaps in time with the first bit of the target waveform $y_1$. In other words, the electronic counter should always start counting at the beginning of the target waveform.

Using the approaches herein, data mining at tens of GHz rates should be possible using commercially available components and incorporating the techniques disclosed herein together with stabilized high speed modelocked lasers as the source of optical combs. The actual data processing speed of the optoelectronic logic gates disclosed herein linearly increases with the number of channels used in the system, since the logic gate operates on N bits from different channels simultaneously.

The foregoing disclosure as been presented for purposes of illustration and description. The disclosure is not intended to be exhaustive or to limit the disclosure to the precise forms disclosed. Various modifications or variations are possible in light of the above teachings. The implementations discussed, however, were chosen and described to illustrate the principles of the disclosure and their practical application to thereby enable one of ordinary skill in the art to utilize the disclosure in various implementations and with various modifications as are suited to the particular use contemplated. All such modifications and variations are within the scope of the disclosure as determined by the appended claims when interpreted in accordance with the breadth to which they are fairly and legally entitled.

What is claimed is:

1. A method for detecting a target pattern in a data stream, the method comprising:
   generating N delayed electrical data bitstreams from an electrical data bitstream having N bits, each of the N delayed electrical data bitstreams being delayed by an additional bit time as compared to the previous one of the N delayed electrical data bitstreams;
   superimposing the data bits from one of the N delayed electrical data bitstreams onto a first optical input bitstream to produce a pair of first-stage optical output bitstreams, the first one carrying the data bits from the one of the N delayed electrical data bitstreams and the second one carrying a complement of the data bits from the one of the N delayed electrical data bitstreams;
   comparing target bits from an electrical target bitstream having N bits with the data bits carried by the first one of the first-stage optical output bitstreams, and with a complement of the electrical data bit carried by the second one of the first-stage optical output bitstreams, to determine whether each of the target bits is same as each of the respective data bits;
   repeating the superimposing and the comparing with successive ones of the N delayed electrical bitstreams; and
   indicating a match when N of the target bits are determined by the comparing to be same.

2. The method of claim 1, further comprising: receiving the electrical target bitstream.

3. The method of claim 1, further comprising: receiving the electrical data bitstream.

4. An apparatus for detecting a target pattern in a data stream, the method comprising:
   a first stage comprising an array of interferometric switches, each of the interferometric switches configured to output a pair of first-stage optical output bitstreams at a respective one of a plurality of different wavelengths, the first one of the pair carrying data bits from a respective one of a plurality of N delayed electrical data bitstreams and the second one of the pair carrying a complement of the data bits from the respective one of the N delayed electrical data bitstreams;
   a second stage configured to receive an electrical target bit stream, a complement of the electrical target bit stream, and the pair of first stage optical output bitstreams, and further configured to produce another optical output bitstream indicating whether target bits from the electrical target bitstream are the same as data bits from the N delayed electrical data bitstreams; and a match stage configured to monitor the plurality of optical output bitstreams for an indication that one of the target bits and a respective one the data bits is same, and to indicate a match when N of the target bits are determined to be same.

5. The apparatus of claim 4, wherein the second stage comprises a pair of optical amplitude modulators.

6. The apparatus of claim 4, wherein the second stage comprises a pair of optical amplitude modulators, the first one of the pair of optical amplitude modulators configured to receive one of the first-stage optical output bitstreams and the electrical target bit stream, the second one of the pair of optical amplitude modulators configured to receive the other the first-stage optical output bitstreams and the complement of the electrical target bit stream.

7. The apparatus of claim 4, each of the array of interferometric switches configured to receive an optical input timing bitstream at one of a plurality of different wavelengths.

8. The apparatus of claim 4, further comprising a pair of optical wavelength combiners configured to:
    receive one of the first-stage optical output bitstreams from each of the interferometric switches; and
    combine the received first-stage optical output bitstreams to produce a combined first-stage optical output bitstream,
    the first optical wavelength combiner in the pair carrying the data bits from the one of the N delayed electrical data bitstreams, the second optical wavelength combiner in the pair carrying the complement of the data bits from the one of the N delayed electrical data bitstreams.

9. The apparatus of claim 4, further comprising:
    an optical wavelength splitter configured to produce a plurality of optical output bitstreams together indicating whether the target bits and the data bits are same.

* * * * *